United States Patent [19]

Kornblit

[11] Patent Number: 4,892,635

[45] Date of Patent: Jan. 9, 1990

[54] PATTERN TRANSFER PROCESS UTILIZING MULTILEVEL RESIST STRUCTURE FOR FABRICATING INTEGRATED-CIRCUIT DEVICES

[75] Inventor: Avinoam Kornblit, Highland Park, N.J.

[73] Assignee: American Telephone and Telegraph Company AT&T Bell Laboratories, Murray Hill, N.J.

[21] Appl. No.: 153,579

[22] Filed: Feb. 8, 1988

Related U.S. Application Data

[63] Continuation of Ser. No. 878,606, Jun. 26, 1986, abandoned.

[51] Int. Cl.[4] ............................................ H01L 21/312
[52] U.S. Cl. .......................... 204/192.36; 204/192.35; 156/643; 156/646; 156/657; 156/659.1
[58] Field of Search ...................... 204/192.32, 192.35, 204/192.36, 192.37; 156/643, 646, 653, 655, 657, 659.1, 668

[56] References Cited

U.S. PATENT DOCUMENTS

| 4,244,799 | 1/1981 | Fraser et al. | 204/192 |
| 4,523,976 | 6/1985 | Bukhman | 204/192.36 XR |
| 4,528,438 | 7/1985 | Poulsen et al. | 204/192.35 XR |
| 4,536,249 | 8/1985 | Rhodes | 204/192.36 XR |
| 4,568,598 | 2/1986 | Bilkadi et al. | 204/192.36 XR |

FOREIGN PATENT DOCUMENTS 0160617  10/1982  Japan ........................ 204/192.36

Primary Examiner—Nam X. Nguyen
Attorney, Agent, or Firm—Bruce S. Schneider; Lucian C. Canepa

[57] ABSTRACT

Reactive ion etching of the planarizing layer of a multilevel resist structure utilized to make integrated-circuit devices is carried out employing a plasma derived from carbon dioxide. The etching step is characterized by high throughput, good linewidth control, negligible radiation damage and low sensitivity to process parameter variations.

7 Claims, 1 Drawing Sheet

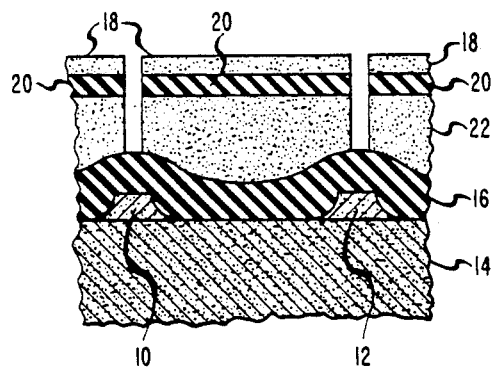

PATTERN TRANSFER PROCESS UTILIZING MULTILEVEL RESIST STRUCTURE FOR FABRICATING INTEGRATED-CIRCUIT DEVICES

This application is a continuation of application Ser. No. 878,606, filed June 26, 1986, abandoned.

BACKGROUND OF THE INVENTION

This invention relates to a pattern transfer process for making integrated-circuit devices and, more particularly, to an improved method for transferring a pattern defined in resist into the planarizing layer of a multilevel resist structure.

Increasing miniaturization of semiconductor integrated-circuit devices is the basis for reduced unit cost per function and for improved performance. Feature sizes in very-large-scale-integrated (VLSI) devices thus continue to get smaller. Some predict that minimum feature sizes in VLSI devices in actual production will certainly be less than one micrometer ($\mu$m) before 1990.

As feature sizes of VLSI devices decrease, processing requirements for fabricating the devices become more critical. These requirements include the availability of resists characterized by extremely high sensitivity and resolution. Moreover, for improved resolution and linewidth control, such resists must in many cases of practical importance be included in multilevel resist structures such as the so-called trilevel structure described in U.S. Pat. No. 4,244,799 and in "High Resolution, Steep Profile, Resist Patterns" by J. M. Moran and D. Maydan, The Bell System Technical Journal, Vol. 58, No. 5, May–June 1979, pages 1027–1036. Such a trilevel structure typically includes a top resist layer, an intermediate masking layer and a bottom planarizing layer.

In a trilevel structure as heretofore proposed, a lithographically defined pattern in the resist layer is first transferred into the intermediate masking layer. Subsequently, utilizing the pattern in the intermediate layer as a mask, the planarizing layer is patterned. This last-mentioned transfer step is, for example, carried out in a reaction chamber by dry etching techniques utilizing an oxygen plasma to pattern the planarizing layer, as described in the aforedescribed references.

As feature sizes in integrated-circuit devices decrease to one $\mu$m and below, it has become exceedingly difficult in practice to maintain high quality linewidth control at relatively high etching rates when utilizing an oxygen plasma to pattern the planarizing layer of a multilevel resist structure. By adjusting the rate of flow of oxygen into the reaction chamber and the value of the bias voltage on the electrode that holds the device to be etched, the characteristics of the etching process can be selectively varied. But adequate linewidth control is usually achieved in this manner at the expense of etching rate. And attempts to increase etching rate typically degrade linewidth control and also may cause radiation damage to the device being etched.

Accordingly, efforts have been directed by workers skilled in the art at trying to devise improved etching techniques for transferring a pattern into the planarizing layer of a multilevel resist structure. In particular, these efforts have been directed at trying to achieve good linewidth control, high etching rates and negligible radiation damage to the device being etched. It was recognized that these efforts, if successful, had the potential to significantly increase the quality and decrease the cost of extremely fine-feature integrated-circuit devices.

SUMMARY OF THE INVENTION

An object of the present invention is to provide an improved pattern transfer process for making integrated-circuit devices. More specifically, an object of this invention is an improved method for transferring a fine-featured pattern defined in resist into the planarizing layer of a multilevel resist structure.

Briefly, these and other objects of the present invention are realized in a specific illustrative embodiment thereof in which the planarizing layer of a multilevel resist structure formed on an integrated-circuit device is anisotropically patterned in a reactive-ion-etching step in a reaction chamber in a plasma derived from carbon dioxide. Pure carbon dioxide gas introduced into the chamber is effective to etch the layer at a relatively high rate with good linewidth control and negligible radiation damage to the device. But, in accordance with the principles of the present invention, anisotropic etching of the planarizing layer can also be effectively carried out in a plasma derived from at least approximately ten percent by volume carbon dioxide combined with an inert gas. Except for a slightly lower etching rate, such a combination of gas provides the same advantages as those specified above for pure carbon dioxide.

A complete understanding of the present invention and of the above and other features and advantages thereof may be gained from a consideration of the following detailed description presented hereinbelow in connection with the accompanying single-figure drawing, which is not drawn to scale.

The drawing schematically represents a portion of a standard integrated-circuit device that comprises conductive elements 10 and 12 disposed on a substrate 14. Deposited on the top surface of the substrate 14 and covering the elements 10 and 12 is a layer 16 made of a conventional dielectric material such as p-doped glass.

In accordance with standard steps of a known device fabrication sequence, openings or windows are to be formed in the layer 16 is aligned registry with the underlying conductive elements 10 and 12. A conductive material such as aluminum will then be deposited on the top surface of the device and in the aligned windows to establish electrical connections from an upper level of the device structure to the elements 10 and 12.

A trilevel resist structure of the type described in the aforecited Fraser et al patent and Moran et al article is a particularly advantageous way of patterning the layer 16. As indicated in the drawing, such a known trilevel structure includes, from top to bottom, layers 18, 20, and 22.

The layer 18 shown in the drawing comprises a positive or negative resist material that can be selectively patterned by, for example, directing light, electrons, X-rays, or ions thereat. A wide variety of such materials is well known in the art. Many standard techniques are available for selectively exposing and developing these materials to form a specified high-resolution pattern in the layer 18.

The intermediate layer 20 in the known structure shown in the drawing comprises, for example, a 1200-Angstrom-Unit (Å)-thick layer of plasma-deposited silicon dioxide. In standard ways, the pattern in the resist layer 18 is transferred into the layer 20 by dry etching techniques. Illustratively, this is done by either plasma or reactive-ion etching the layer 20 with, for example, $CHF_3$, utilizing the patterned layer 18 as a dry-etch-resistant mask therefor.

The planarizing layer 22 included in the standard depicted structure comprises, for example, a relatively thick layer of an organic material. A number of available organic materials such as a variety of polymers are suitable for forming the layer 22. Such materials include a variety of known resists and polyimides. Illustratively, the layer 22 comprises a 1.8-$\mu$M-thick layer of HPR-206 which, after deposition, is, for example, baked for about 20 minutes at approximately 210 degrees Celsius. HPR-206 is a standard positive photoresist commercially available from Philip A. Hunt Chemical Corporation, Palisades Park, N.J.

The pattern in the layer 20 is transferred into the thick layer 22 in a dry etching step. Conventionally, this is done, for example, in a reactive-ion-etching step utilizing pure oxygen to form a plasma, with the patterned layer 20 acting as a mask.

A conventional trilevel structure of the type shown in the drawing and described above is an important factor in being able in practice to achieve submicron lithography. Unfortunately, however, as specified earlier above, it has become exceedingly difficult in practice to maintain high-quality linewidth control at relatively high etching rates when utilizing an oxygen plasma to pattern features of one $\mu$M and below in the planarizing layer 22.

In accordance with the principles of the present invention, a carbon dioxide plasma rather than an oxygen plasma is utilized to pattern the planarizing layer 22 of the multilevel resist structure shown in the drawing. Illustratively, patterning of the layer 22 is carried out in a reactive-ion-etching step utilizing at least approximately ten percent carbon dioxide gas by volume. When less than pure carbon dioxide is utilized, it is mixed with an inert gas such as helium or aragon.

By way of example, the device to be etched in accordance with applicant's invention is placed in the reaction chamber of a standard reactive-ion-etching system. Illustratively, the device is place on the cathode electrode of a so-called hex reaction of the type manufactured by Applied Materials, Inc., Santa Clara, Calif. This reactor is designated by Applied Materials as its AME 8100 Series Plasma Etch System.

In accordance with the principles of applicant's invention, the direct-current bias on the aforementioned cathode electrode in the reaction chamber is established at a value in the range of about 450-to-550 volts. The flow of carbon dioxide into the chamber is controlled to be approximately 100-to-500 standard cubic centimeters per minute. And the pressure within the chamber is maintained at about 10-to-20 milliTorr.

For the illustrative conditions specified above, the planarizing layer 22 of the device shown in the drawing is etched at a rate of about 500-to-650 Å per minute. This etching rate has been observed to be load dependent; that is, the etch rate increases as the exposed surface area of the layer 22 to be etched decreases.

Etching carried out in accordance with applicant's invention as specified above produces essentially vertical walls in the planarizing layer 22 with substantially no undercutting thereof. Linewidth loss during etching with carbon dioxide has been determined to be extremely small, ranging in practice from 0-to-0.05 $\mu$M. Moreover, applicant's etching process as described herein has been observed to exhibit excellent uniformity and reproducibility and to have a very low sensitivity to process parameter variations. Further, devices etched by this process have been determined to suffer negligible radiation damage.

In some cases involving patterning of a multilevel resist structure, polymer build-up may occur on the walls or on other surfaces of the reaction chamber. Such build-up stems, for example, from standard $CHF_3$ etching of the intermediate masking layer 20. In those cases, it may be advantageous, prior to commencing etching of the exposed layer 22 with carbon dioxide in the particular manner specified above, to establish an oxygen plasma in the chamber for several minutes to remove any polymer that has formed within the chamber. A conventional oxygen plasma etching step of the type priorly employed in the art to etch through the entire thickness of the layer 22 is effective to remove such build-up. Surface portions of the layer 22 will also thereby be etched. But, in accordance with the principles of the present invention, the major extent of the thickness of the layer 22 is then etched with carbon dioxide in the particular manner described above.

Finally, it is to be understood that the above-mentioned structures and processing techniques are only illustrative of the principles of the present invention. In accordance with these principles, numerous modifications and alternatives may be devised by those skilled in the art without departing from the spirit and scope of the invention. For example, although primary emphasis herein has been directed to a multilevel resist structure of the trilevel type, it is to be understood that applicant's inventive principles are also applicable to so-called bilevel resist structures. In a bilevel structure, a patterned resist layer such as the layer 18 shown in the drawing directly overlies a planarizing layer such as the layer 22 described herein. Additionally, for profile purposes, it may be advantageous in some cases of practical importance to add some oxygen to carbon dioxide to from a plasma for etching the planarizing layer.

What is claimed is:

1. A method for fabricating an integrated-circuit device comprising the steps of forming a multilevel structure that includes a relatively thin patterned masking layer comprising a material selected from the group consisting of resist material and silicon dioxide overlying a relatively thick planarizing layer comprising a hardened polymer on a substrate, forming a pattern including at least one structure having a dimension of 1 micron or less in said thin patterned masking layer, transferring said pattern by anisotropically etching said planarizing layer in a reaction chamber in a plasma derived from carbon dioxide to transfer the pattern of said relatively thin masking layer into said relatively thick planarizing layer, wherein the resolution of said pattern during said transfer is not substantially degraded, and wherein the time taken to effect said transfer is not substantially longer compared to the time required to transfer said pattern with the same resolution utilizing an oxygen plasma.

2. A method as in claim 1 wherein said device is positioned within said chamber on the cathode electrode of a reactive-ion-etching apparatus.

3. The method of claim 1 wherein said gas comprises a mixture including 10 volume percent carbon dioxide and an inert gas.

4. A method for fabricating an integrated-circuit device comprising the steps of forming a multilevel structure that includes a relatively thin patterned masking layer comprising a material selected from the group consisting of resist material and silicon dioxide overlying a relatively thick planarizing layer comprising a hardened polymer on a substrate, said method comprising, forming a pattern including at least one structure having a dimension of 1 micron or less in said thin patterned masking layer transferring said pattern by placing said device in a reaction chamber, introducing a gas comprising carbon dioxide into said chamber, and establishing a plasma in said chamber to anisotropically etch through said planarizing layer to transfer the pattern of said relatively thin masking layer into said relatively thick planarizing layer wherein the resolution of said pattern during said transfer is not substantially degraded and wherein the time taken to effect said transfer is not substantially longer compared to the time required to transfer said pattern with the same resolution utilizing an oxygen plasma.

5. A method as in claim 4 wherein said gas comprises at least ten volume percent carbon dioxide and an inert gas.

6. A method as in claim 4 wherein said gas comprises carbon dioxide and oxygen.

7. A method as in claim 4 wherein, prior to said etching step in which the introduced gas comprises carbon dioxide, surface portions only of said planarizing layer are etched in a plasma derived only from oxygen.

* * * * *